(12) United States Patent
Lim et al.

(10) Patent No.: US 6,797,598 B2
(45) Date of Patent: Sep. 28, 2004

(54) METHOD FOR FORMING AN EPITAXIAL COBALT SILICIDE LAYER ON MOS DEVICES

(75) Inventors: Chong Wee Lim, Urbana, IL (US); Chan Soo Shin, Daejeon (KR); Daniel Gall, Troy, NY (US); Ivan Georgiev Petrov, Champaign, IL (US); Joseph E. Greene, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 10/226,101

(22) Filed: Aug. 22, 2002

(65) Prior Publication Data

US 2004/0038528 A1 Feb. 26, 2004

(51) Int. Cl.⁷ .......................................... H01L 21/3205
(52) U.S. Cl. .................. 438/586; 438/592; 438/630; 438/649; 438/651; 438/655; 438/658; 438/678; 438/682; 438/683; 438/685; 438/686
(58) Field of Search ................................ 438/586, 592, 438/630, 649, 651, 655, 658, 678, 682, 683, 685, 686

(56) References Cited

U.S. PATENT DOCUMENTS

| | | | |
|---|---|---|---|
| 455,301 A | 11/1891 | Gibson et al. | |
| 4,814,294 A | 3/1989 | West et al. | |
| 5,356,837 A | 10/1994 | Geiss et al. | |
| 5,536,684 A | 7/1996 | Dass et al. | |
| 5,736,461 A | 4/1998 | Berti et al. | |
| 6,008,124 A | * 12/1999 | Sekiguchi et al. | 438/651 |
| 6,337,272 B1 | * 1/2002 | Hamanaka | 438/651 |

OTHER PUBLICATIONS

S. L. Zhang, J. Cardenas, F.M. d'Heurle, B.G. Svensson, and C.S. Petersson, "On the Formation of Epitaxial $CoSi_2$ from the reaction of Si with a Co/Ti bilayer", Appl. Phys. Lett. 66 (1), Jan. 2, 1995, pp. 58–60.

M. Falke, B. Gebhardt, G. Beddies, S. Telchert, and H.J. Hinneberg, "Epitaxial $CoSi_2$ by solid phase reaction of Co/Ti and Co/Hf bilayers on Si(001)", Microelectronic Engineering 55 (2001), pp. 171–175.

Hwa Sung Rhee, Byung Tae Ahn, and Dong Kyun Sohn, "Growth behavior and thermal stability of epitaxial $CoSi_2$ layer from cobalt–carbon films on (100) Si substrate", Journal of Applied Physics, vol. 86, No. 6, Sep. 15, 1999.

* cited by examiner

Primary Examiner—Lynne Gurley
(74) Attorney, Agent, or Firm—Greer, Burns & Crain, Ltd.

(57) ABSTRACT

A method for forming an epitaxial cobalt silicide layer on a MOS device includes sputter depositing cobalt in an ambient to form a first layer of cobalt suicide on a gate and source/drain regions of the MOS device. Subsequently, cobalt is sputter deposited again in an ambient of argon to increase the thickness of the cobalt silicide layer to a second thickness.

16 Claims, 2 Drawing Sheets

METHOD FOR FORMING AN EPITAXIAL COBALT SILICIDE LAYER ON MOS DEVICES

STATEMENT OF GOVERNMENT INTEREST

This invention was made with United States government assistance through the U.S. Department of Energy Grant No. DEFG02-ER-45439. The government has certain rights in this invention.

FIELD OF INVENTION

The present invention generally relates to a process for producing integrated circuit devices, and more particularly to a method for forming an epitaxial cobalt silicide layer on MOS devices.

BACKGROUND

Cobalt silicide ($CoSi_2$) has been widely accepted as an electrical contact and interconnect material for use in forming MOS devices. Significant reduction in parasitic electrical resistance is achieved with the formation of a $CoSi_2$ layer, which therefore enhances drive-current and speed of the devices. One commonly known method of forming a $CoSi_2$ layer is a self-aligned silicide (salicide) process, in which cobalt is deposited on a MOS structure, and reacts with the exposed silicon and polysilicon of the MOS structure in a heated environment to form a silicide layer. The unreacted metal is then removed from the MOS structure by using a selective etching process, leaving the silicide over the gate and the source/drain region.

As devices are scaled to sub-0.18 μm and beyond, the requirements for salicide process become more stringent. In order for devices to operate in the deep sub-micron regime, shallow source/drain junctions are incorporated to prevent junction "punch-through" and reduce the effect of drain-induced barrier lowering (DIBL). The presence of non-uniformity or interface roughness at the silicide-silicon interface is detrimental to the integrity of shallow junctions, and it could result in excessive junction leakage current. As a result, forming epitaxial $CoSi_2$ has become of critical importance, especially for deep sub-micron devices.

One known method of forming epitaxial $CoSi_2$ involves the use of a thin metal interlayer between the cobalt layer and silicon substrate. Another method includes depositing a thin titanium nitride or titanium tungsten film as a capping-layer on top of the cobalt layer. Both of these methods require subjecting their respective structures to heat treatment processes to form cobalt silicide. These known methods require additional processing steps and/or an additional sputtering chamber and target for depositing the interlayer or the capping-layer. Moreover, extra cleaning steps are also required to remove the additional interlayer and capping-layer upon silicide formation. Consequently, these methods further result in increased process cycle time due to the additional processing steps involved.

SUMMARY OF THE INVENTION

The present invention is directed to a method for forming an epitaxial cobalt silicide layer on a MOS device. The method includes the step of sputter depositing cobalt in an ambient, forming a first layer of cobalt silicide on gate and the source/drain regions of the MOS device. Subsequently, cobalt may be sputter deposited again in an ambient of argon to increase the thickness of the cobalt silicide layer to a second thickness.

DETAILED DESCRIPTION OF THE INVENTION

Figure 1:
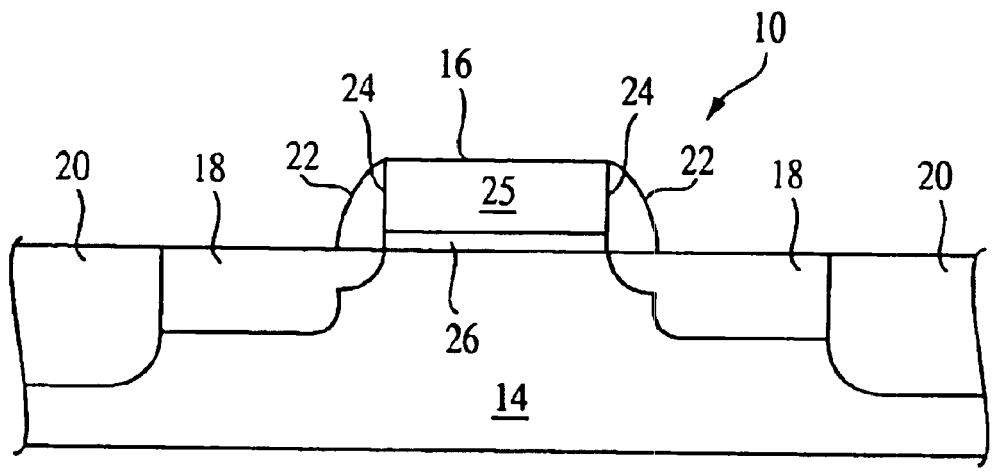
FIGS. 1–3 are sectional views illustrating the steps for forming a cobalt silicide layer on a MOS device in accordance with one embodiment of the present invention.

Turning now to FIG. 1, a MOS device 10 includes a Si substrate 14, a gate electrode 16, and source/drain junctions 18 on both sides of the gate. Also provided on the substrate 14, adjacent to each of the source/drain junctions 18 are shallow trench isolations (STI) 20 that provide electrical isolations from neighboring devices. Spacers 22 are located adjacent both sides 24 of the gate electrode 16 to electrically isolate the gate from the source/drain junctions 18. The gate electrode 16 is formed by depositing a layer of polysilicon 25 over a thin layer of gate oxide 26 in a known manner. The source/drain regions 18 are also created in a known manner using ion-implantation of arsenic or boron ions, for example. The shallow trench isolations (STI) 20 are formed by etching the Si substrate 14, followed by oxide deposition and chemical-mechanical polishing (CMP) processes.

Figure 2:
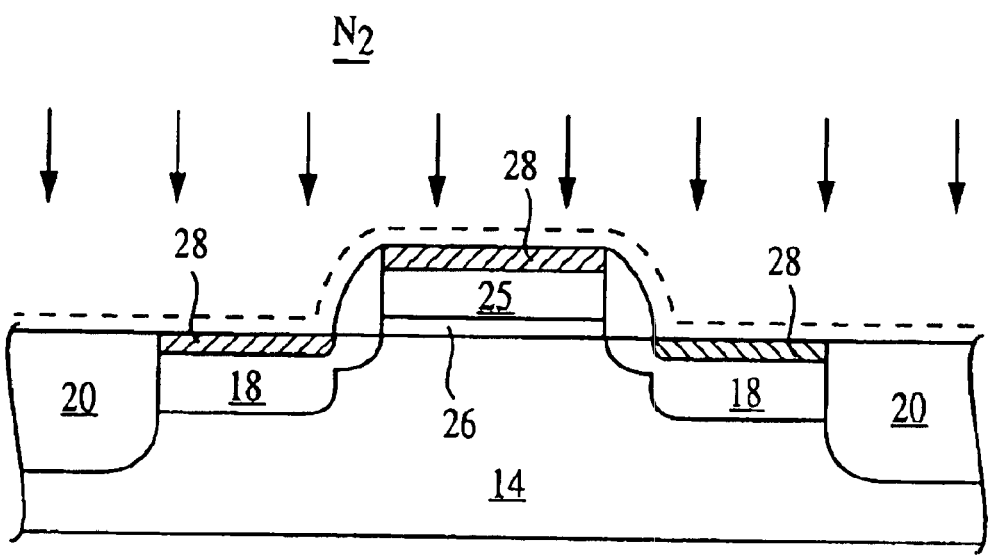

Turning now to FIG. 2, the first cobalt layer is sputter-deposited (indicated by arrows) in an ambient, preferably of an argon-nitrogen sputtering-gas mixture, onto the surface of the MOS device 10, including the gate electrode 16, the source/drain regions 18 and the STI 20, to form a layer 28 of nitrogen-doped cobalt silicide ($CoN_xSi_y$). The first thickness of the $CoN_xSi_y$ layer 28 can be from approximately 5 Å to about 100 Å, depending on the second thickness of $CoSi_2$ required. Preferably, the first thickness of $CoN_xSi_y$ layer is at about 10 Å, after which about 100 Å of Co is deposited. The deposition of this first layer 28 can also be performed using a sputtering gas mixture of different combinations and concentration of inert gas (including argon, helium, neon, krypton, xenon) with, for example, nitrogen, oxygen, ammonia ($NH_3$) and carbon gas source (for example, $CO_2$, $CH_4$, $C_2H_6$). In one embodiment, an inert gas mixture of about 50% nitrogen and a remaining argon gas mixture may be implemented.

Figure 3:
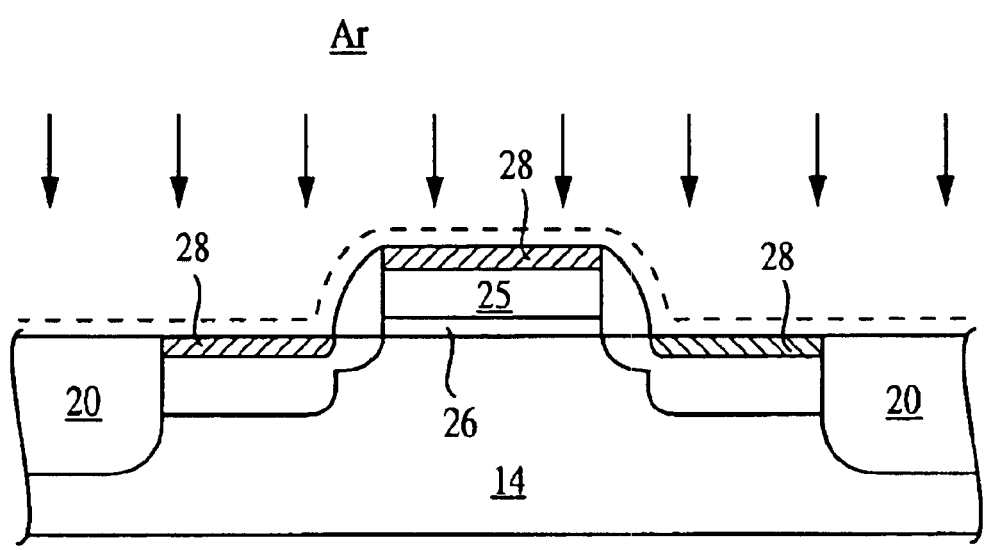

Turning now to FIG. 3, upon formation of the first $CoN_xSi_y$ layer 28 with the desired thickness, subsequent sputter deposition of cobalt can be performed in an ambient of argon within the same chamber without breaking vacuum. Optionally, there may be a break in time after the first layer is formed and before the start of the subsequent sputter deposition. Cobalt deposition is performed until the thickness of the cobalt silicide layer 28 increases to a second thickness of approximately 50 Å to approximately 1000 Å. Preferably, the second thickness of the $CoSi_2$ is approximately 300 Å.

The growth of the cobalt silicide layer 28 during both the first and second formations is performed using known processes such as conventional solid phase epitaxy (SPE) or reactive deposition epitaxy (RDE). For RDE growth, the substrates are heated and maintained at a temperature ranging from 400 °C. to 900° C. during Co deposition. For samples grown by SPE, an annealing step is carried out after Co deposition at temperatures ranging from 400° C. to 900° C. Pressure during deposition is about 20 mTorr. However, the pressure can vary from 5 mTorr to 100 mTorr. The deposition rate of Co is about 1 Å/s, but ranges from approximately 0.005 Å/s to 100 Å/s.

From the foregoing description, it should be understood that an improved method for forming an epitaxial $CoSi_2$ layer on MOS devices has been shown and described which has many desirable attributes and advantages. The present method enables the formation of epitaxial $CoSi_2$ with high quality silicide/silicon interface, which minimizes junction leakage. Moreover, the method in accordance with an embodiment of the present invention is fully compatible with the standard CMOS processing techniques without the requirement of adding additional processing steps.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A method for forming an epitaxial cobalt silicide layer on a MOS device, said method comprising the steps of:
   sputter depositing cobalt in a nitrogen ambient to form layer of cobalt silicide having a first thickness on a gate and source/drain regions of the MOS device; and,
   sputter depositing cobalt in an ambient of argon to increase the thickness of said cobalt silicide layer to a second thickness.

2. The method as defined in claim 1 wherein said nitrogen ambient comprises argon and nitrogen.

3. The method as defined in claim 2 wherein said second thickness of said cobalt silicide layer is approximately 50 Å to 1000 Å.

4. The method as defined in claim 1 wherein said nitrogen ambient comprises nitrogen and an inert gas.

5. The method as defined in claim 4 wherein said inert gas is argon, helium, neon, krypton or xenon.

6. The method of claim 1 wherein said cobalt silicide layer is a nitrogen doped layer.

7. The method as defined in claim 1 wherein said first thickness of said cobalt silicide layer is from approximately 5 Å to 100 Å.

8. The method as defined in claim 1 wherein solid phase epitaxy (SPE) is used in said sputter depositing steps for forming said cobalt silicide layer to said first thickness and said second thickness.

9. The method as defined in claim 1 wherein reactive deposition epitaxy (RDE) is used in said depositing steps for forming said cobalt silicide layer to said first thickness and said second thickness.

10. A method for forming an epitaxial cobalt silicide layer on a MOS device, said method comprising the steps of:
    sputter depositing cobalt in an ambient of a gas mixture of inert gas and nitrogen, oxygen, ammonia or a carbon gas to form a layer of cobalt silicide having a first thickness on at least the gate and source/drain regions of the MOS device; and,
    sputter depositing cobalt in an ambient of argon to increase the thickness of said cobalt silicide layer to a second thickness.

11. The method as defined in claim 10 wherein said inert gas is argon, helium, neon, krypton or xenon.

12. A method for forming an epitaxial cobalt silicide layer on a MOS device, said method comprising the steps of:
    sputter depositing cobalt in a nitrogen ambient comprising nitrogen and an inert gas to form a layer of cobalt silicide having a first thickness on gate and source/drain regions of the MOS device; and,
    sputter depositing cobalt in an ambient of argon to increase the thickness of said cobalt silicide layer to a second thickness.

13. The method as defined in claim 12 wherein said inert gas is argon, helium, neon, krypton or xenon.

14. The method as defined in claim 12 wherein said first thickness of said cobalt silicide layer is from approximately 5 Å to 100 Å.

15. The method as defined in claim 12 wherein solid phase epitaxy (SPE) is used in said depositing steps.

16. The method as defined in claim 12 wherein reactive deposition epitaxy (RDE) is used in said depositing steps.

* * * * *